United States Patent [19]
Loeffler et al.

[11] 3,984,687
[45] Oct. 5, 1976

[54] SHIELDED MAGNETIC LENS AND DEFLECTION YOKE STRUCTURE FOR ELECTRON BEAM COLUMN

[75] Inventors: Karl H. Loeffler, San Jose, Calif.; Hans C. Pfeiffer, Ridgefield, Conn.

[73] Assignee: International Business Machines Corporation, Armonk, N.Y.

[22] Filed: Mar. 17, 1975

[21] Appl. No.: 559,275

[52] U.S. Cl. .................................. 250/396 ML
[51] Int. Cl.² .................................. H01J 37/00
[58] Field of Search ............ 250/396, 396 ML, 311

[56] References Cited
UNITED STATES PATENTS

| | | | |
|---|---|---|---|
| 2,469,165 | 5/1949 | Hillier | 250/396 ML |
| 2,637,000 | 4/1953 | Page | 250/396 ML |
| 2,859,363 | 11/1958 | Leisegang et al. | 250/396 ML |
| 3,736,423 | 5/1973 | Katagiri et al. | 250/396 ML |
| 3,812,365 | 5/1974 | Le Poole | 250/396 ML |

OTHER PUBLICATIONS

"A New Concept of Superimposed Deflection and Projection for Probe-forming Electron-Beam Systems", Pfeiffer, Eighth International Congress of Electron Microscopy, CanBerra, 1974 vol. 1, pp. 56–57.

*Primary Examiner*—Alfred E. Smith
*Assistant Examiner*—B. C. Anderson
*Attorney, Agent, or Firm*—James M. Thomson; Theodore E. Galanthay

[57] ABSTRACT

A shielded magnetic lens and deflection yoke structure for an electron beam column which minimizes aberrations in the lens system caused by winding asymmetry in the field coil, as well as aberrations due to eddy currents created within the magnetic circuit of the lens by interaction with the field of the deflection yoke. The shield includes a polepiece structure for the magnetic electron lens generally comprising a hollow cylinder formed of a plurality of precisely machined magnetic discs stacked concentrically with precisely machined nonmagnetic discs in alternating sequence with the lens coil positioned adjacent the periphery of the cylinder and the deflection yoke positioned within the cylinder or proximate to either end thereof. In one preferred embodiment of the invention the magnetic discs are formed of a nonconductive material such as ferrite and the nonmagnetic discs are formed of alumina.

11 Claims, 2 Drawing Figures

SHIELDED MAGNETIC LENS AND DEFLECTION YOKE STRUCTURE FOR ELECTRON BEAM COLUMN

BACKGROUND OF THE INVENTION

1. Field of the Invention

The present invention relates to a shielded composite magnetic lens and deflection yoke arrangement for an electron beam column. More particularly, the invention concerns such a structure particularly adapted for use with an electron beam column capable of high resolution scanning, i.e. in the order of 20,000 lines in a field 0.2 inches square, wherein the magnetic lens has relatively long focal length, i.e. of at least one inch.

2. Description of the Prior Art

Electron beam columns are well known in the prior art as they comprise portions of electron microscopes and probe forming systems adapted for structure and materials analysis. Furthermore, electron beam columns have utility in systems for microfabrication of electrical components such as large scale integrated semiconductor circuits. For example, U.S. Pat. No. 3,644,700, issued Feb. 22, 1972, to Kruppa et al describes an electron beam column adapted to form desired patterns on semiconductor wafers.

Electron beam columns utilized in connection with microfabrication applications generally include an electron beam source, a condenser lens, alignment stages, demagnification lens stages, a projection lens, a deflection unit, and a target stage, arranged in well known fashion.

A projection lens as utilized in an electron beam column is usually a magnetic lens, including magnetic pole pieces and image generating coils through which an electron beam is directed or focused upon the target. Thus, the magnetic field produced within the lens acts to focus the electrons within the beam in a manner analogous to the focusing achieved by a physical lens within a light optical system. An example of a magnetic lens utilized for this purpose is described in U.S. Pat. No. 3,659,097, issued Apr. 25, 1972, to Richard Bassett et al.

In the electron beam columns described in the above mentioned patents, it is conventional to locate a deflection yoke proximate the projection lens in order to deflect the electron beam back and forth across the target in a scanning mode as required for particular applications. Certain electron beam columns in the prior art are constructed with the deflection yoke or yokes physically arranged to deflect the beam before or after the final projection lens depending upon desired applications. Moreover, recently designed systems have included a deflection yoke located within the pole pieces of the magnetic lens, again for particular purposes.

Depending upon the relative location of the projection lens with respect to the deflection yoke, the lens is found to exhibit certain aberration characteristics. For example, performing the deflection operation before the electron beam passes through the projection lens enables construction of a system having a projection lens with a relatively short focal length. This tends to reduce on axis aberration in the lens and provide a high resolution capability to the system. A disadvantage is that the deflection angle and all deflection aberrations in the lens increase rapidly with increasing field coverage, thereby limiting the practical operation of the beam column to relatively small fields of view.

On the other hand, performing deflection after the electron beam passes through the projection lens eliminates off axis aberrations of the lens and reduces the total deflection aberrations, thereby permitting large scale coverage. However, the longer focal length required of the projection lens for such placement of the deflection yoke results in relatively poor resolution within the system and in substantial on axis aberrations of the lens.

The disadvantages of deflection yoke placement before or after the projection lens are minimized if the deflection yoke is incorporated within the beam column at a location near the center between the pole pieces of the projection lens. In this configuration, the lens field and the deflection field are superimposed and some of the deflection aberrations of the yoke are compensated by the corresponding off-axis aberrations of the lens.

However, in all three cases of yoke placement the deflection yoke is located proximate to the pole pieces of the lens and the dynamically changing deflection field will interact with conductive pole pieces and cause eddy currents which result in pattern distortions.

Furthermore, to incorporate the deflection yoke between the pole pieces of the lens, the lens normally has to be constructed with a large pole piece gap, which typically results in high astigmatism caused by winding asymmetry of the lens coil. Accordingly, a need exists in the art for electron beam columns with projection lenses constructed with wide pole piece gaps and long focal length wherein static astigmatism is minimized. A need also exists for a beam column wherein eddy current pattern distortions are reduced.

SUMMARY OF THE INVENTION

The present invention relates to an apparatus for use in high scan speed, high resolution probe forming electron beam columns which utilize a pole piece structure in conjunction with a combined projection lens and deflection yoke arrangement, whereby the interaction of the yoke field with the conductive environment is eliminated and the influence of lens coil asymmetry is minimized, thereby resulting in a substantial reduction in lens astigmatism.

The apparatus of the invention generally comprises a projection lens structure including a lens coil positioned around the outer periphery of a shield generally comprising a hollow cylinder formed of a plurality of precisely machined non-conductive magnetic discs stacked concentrically with precisely machined non-conductive non-magnetic discs in alternating sequence, and further including a deflection yoke comprising a core having deflection coils distributed thereon, with the core and coils being positioned in the periphery of the hollow cylinder. The stack of non-conductive, magnetic discs interleaved with non-conductive non-magnetic discs prevents the field of the deflection coil from reaching conductive material within the magnetic circuit of the projection lens thereby minimizing eddy current caused aberrations within the lens. Furthermore, the cylinder acts as an effective shielding means against any interference of the electron beam caused by asymmetries in the winding of the lens coil. At the same time, the stacked structure provides an effective flux gap which produces the desired uniform field parallel to the optical axis and extending over the desired working distance of the lens.

BRIEF DESCRIPTION OF THE DRAWINGS

The foregoing and other objects, features and advantages of the invention will be apparent from the following detailed description of the invention taken in conjunction with the accompanying drawings, wherein.

DETAILED DESCRIPTION OF THE INVENTION

Figure 1:
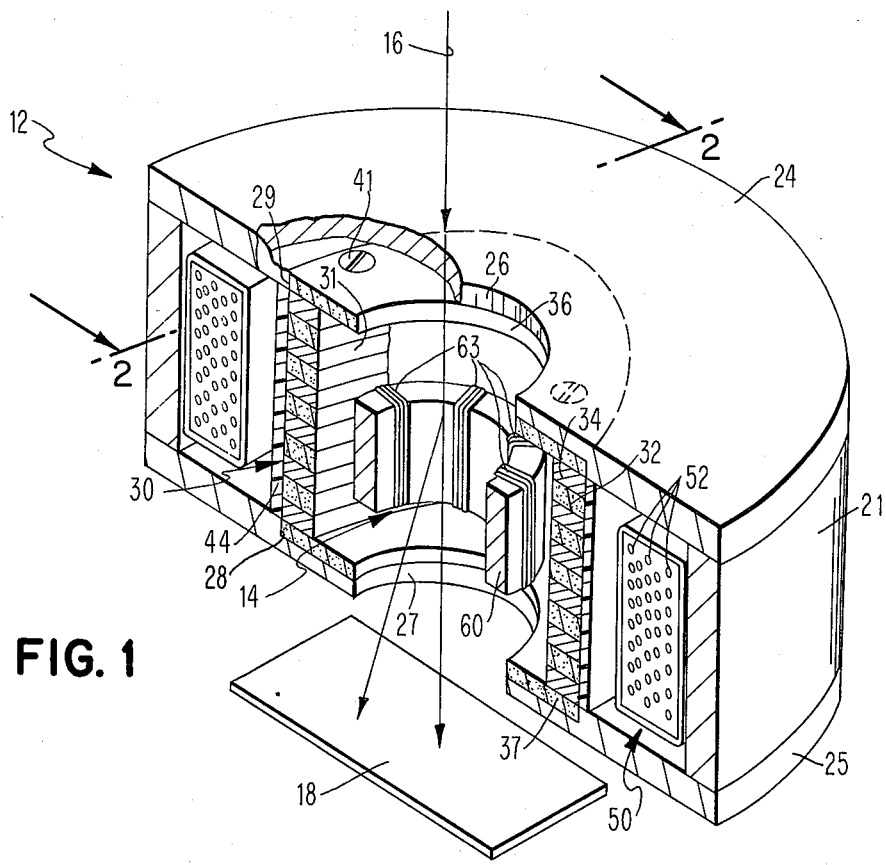
FIG. 1 is a perspective view with parts cut away illustrating the structure of the present invention.

Referring now to the drawings, one preferred embodiment of the invention is particularly illustrated generally comprising an arrangement adapted for use in an electron beam column consisting of a vertical arrangement of separate stages including an electron beam source, a condenser lens, alignment stages, demagnification lens stages, a projection lens, a deflection unit, and a target stage.

Illustrated in FIG. 1 is a general arrangement of a combined or composite projection lens 12 and deflection yoke 14 positioned along the axis of an electron beam 16 so as to focus the beam upon a target 18, and provide scanning capability with respect to the target in well known fashion. Lens 12 is arranged to have a relatively long focal length, i.e. at least one inch.

A back magnetic circuit is provided for the projection lens, including a generally cylindrical outer member 21 formed of magnetic material having secured at the ends thereof upper and lower plates 24, 25, respectively. Plate 24 is fabricated of magnetic material and is of circular configuration that matches the outer periphery of member 21. A circular opening 26 is formed at the center of member 24 whereby an electron beam path is defined therethrough, and a similar opening 27 is formed in member 25 in alignment with opening 26 for the same purpose.

The lower face of member 24 and the upper face of member 25 are formed with partially recessed portions 28, 29 concentric with openings 26, 27, respectively, so as to receive and confine the opposite ends of a generally hollow, cylinder or shield 30 having a central opening or chamber 31 defined therein which permits passage of the electron beam therethrough, and also provides room for the positioning of deflection yoke 14 therein, as shown. Cylinder 30 is generally comprised of a plurality of precisely machined hollow magnetic discs 32 stacked concentrically with precisely machined hollow non-magnetic discs 34 of identical dimension in alternating sequence. Circular hollow magnetic discs 36, 37 are provided at the ends of member 30, each having an outer periphery which matches the outer periphery of discs 32, 34 and an inner periphery which matches the periphery of openings 26, 27, respectively. As shown, the length of cylinder 30 and the diameter of discs 36, 37 are such that a tight fit is achieved between ends of member 30 and the top and bottom surfaces of members 24 and 25, respectively. This serves to exert pressure in an axial direction upon cylinder 30.

Figure 2:
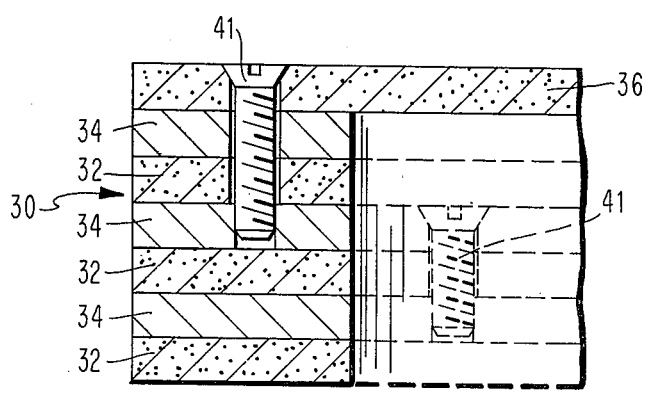
FIG. 2 is a fragmentary view in section taken along lines 2—2 of FIG. 1 which shows certain details of construction of the structure illustrated in FIG. 1.

As shown, discs 32, 34 are joined surface to surface and are secured together, in one embodiment, by the use of screws 41 in the manner illustrated in detail in FIG. 2. In addition to screws 41, the stack of magnetic and non-magnetic discs is secured into a composite structure by means of a hardened bonding material such as epoxy layer 44 formed about the outer periphery of cylinder 30, as shown in FIG. 1.

The composite arrangement of members 21, 24, 25 along with cylinder 30 comprises a magnetic circuit for the projection lens of the electron beam column. The effective flux gap of the magnetic circuit is formed of the composite axial dimension of non-magnetic discs 34. Accordingly, in fabricating cylinder 30, it is extremely important to achieve high tolerance machining of the discs to maintain uniform dimensions for the magnetic and non-magnetic discs taken individually or taken in a stacked array. Therefore, it is desired that the discs be machined to about a 20 microinch tolerance, and that the individual discs be rotated within the stack before it is secured into a unitary structure so as to minimize the total deviation or tolerance within the stack. By rotating individual ones of said discs it has been found that the total tolerance or deviation in the gap on one side of the cylinder with respect to the other side of the cylinder can be reduced to the order of 50 microinches or less.

Epoxy layer 44 is comprised of a suitable hard surfaced epoxy which, when dry, acts in addition to screws 41 to retain discs 32, 34 in fixed relationship to each other. If desired, the final machining of the inner surfaces of discs 32, 34, can be performed after application of epoxy layer 44 and prior to the securing of upper and lower members 36, 37, respectively.

In the preferred embodiment, magnetic discs 32 are preferably formed of non-conductive ferrite material and the non-magnetic discs 34 are preferably formed of a suitable non-conductive ceramic such as alumina. The use of a non-conductive material such as ferrite has advantages which are explained hereinafter. However, discs 32 could also be formed of a low permeability steel, such as Aramco, if desired, although such is not preferred. Likewise, discs 34 could be formed of other non-magnetic materials.

Lens 12 otherwise includes a coil form or spool 50 with a suitable windings 52 formed thereon in conventional fashion. It is important that windings 52 be placed upon spool 50 in as symmetrical fashion as is possible in order to reduce asymmetries in the field created by the windings when energized. It is envisioned that suitable terminals be provided by which windings 52 can be energized from a source not shown, in conventional fashion.

Deflection yoke 14 is illustrated as comprising a generally cylindrical or toroidal core 60 having coils 63 wound thereon and distributed to produce the desired radial field for X and Y deflection of the electron beam, again in conventional fashion. Coils 63 are adapted to be energized from a suitable source and can be numbered and distributed to provide suitable scanning capability for the beam. In the embodiment illustrated, it is envisioned that the deflection arrangement will be adapted to provide a capability of 20,000 lines upon a 0.2 inch wafer. Accordingly, the focusing length of the projection lens would be envisioned to be at least one inch and possibly as much as 5 inches, which dimension is easily possible within electron beam columns wherein the deflection yoke is positioned as shown.

The structure of cylinder 30 provides significant advantages in the reduction of aberrations in the lens where the deflection yoke and the projection lens are oriented proximate to each other. Thus, magnetic members 36, 37 function as pole pieces for the magnetic circuit of the lens and magnetic spacers 32 act in conjunction with members 36, 37 to effectively shield the lens coil, and reduce any asymmetries in the rotational symmetry of the magnetic field provided by the lens coil, thereby reducing astigmatism far below that which would otherwise be present with a long focal length lens. Thus, each of the magnetic discs assumes a nearly uniform magnetic potential, shielding the beam area from the rotational asymmetries of the coil field but transmitting the desired axial field between the top and bottom pole piece plate of the magnetic circuit.

Another important function of cylinder 30 is to shield magnetic fields extending in opposite radial directions from the deflection yoke. Thus, the field distribution of the deflection yoke is restricted to the area inside chamber 31 and this prevents it from interacting with conductive portions of the magnetic circuitry. This, in effect, reduces eddy currents which would otherwise be generated by field line penetration of conductive material within the magnetic circuit. Such eddy currents are objectionable in that they generate magnetic fields opposed to the original yoke field and result in undesirable deflection aberrations. This type of dynamic interaction has heretofore represented a basic limitation for all probe forming electron beam scanning systems.

The use of ferrite material as pole piece material is of particular advantage in this regard since it is non-conductive magnetic material. It has been demonstrated that the use of ferrite material results in the reduction of eddy current effects by more than two orders of magnitude without addition of additional astigmatism or measureable hysteresis effect due to the use of the material.

The use of ferrite for members 36, 37 also results in significant advantages in systems where the deflection yoke is located outside or away from the center of the projection lens. Thus, the arrangement where members 36, 37 overextend the inner periphery of discs 32, 34 acts as a shielding feature for the working length of the lens even if the deflection yoke is located outside the cylinder. Consequently, it is within the purview of the present invention to utilize ferrite polepieces in systems where the deflection yoke is positioned either before or after the projection lens but sufficiently proximate thereto that eddy current aberrations might otherwise occur.

What is claimed is:

1. In an electron beam column having a long focal length projection lens with a deflection yoke positioned near the focal region of said lens, a closed magnetic circuit for said projection lens including at least upper and lower polepieces defining a flux gap therebetween for influencing an electron beam, said polepieces being formed of non-conductive, magnetic material whereby lens aberrations resulting from eddy currents induced into the magnetic circuit of the lens from the field of said proximately located deflection yoke are minimized.

2. The electron beam column defined in claim 1 wherein the focal length of said projection lens is at least one inch and wherein a plurality of hollow magnetic discs are provided, stacked in alternate sequence with a corresponding plurality of hollow non-magnetic discs between said upper and lower polepieces, with the non-magnetic discs forming a flux gap in the magnetic circuit.

3. The electron beam column of claim 2 wherein said magnetic discs and said non-magnetic discs are provided with uniform widths and parallel upper and lower surfaces machined within a tolerance of less than 0.001 inches to provide tightly fitting surfaces.

4. The electron beam column of claim 2 wherein a layer of hardened bonding material is formed about the outer periphery of said magnetic and non-magnetic discs whereby a composite stack of elements is provided that is susceptible of machining to close tolerance as a unit.

5. In an electron beam column:
a projection lens having a long focal length, said lens including a lens winding adapted to be energized by a source of power and a closed magnetic circuit associated with said winding having a flux gap oriented to influence an electron beam of the column throughout a beam area of the lens,
said magnetic circuit including polepiece means formed of non-conductive magnetic material, said polepiece means being associated with said gap to produce a stable field throughout said beam area and
deflection yoke means positioned near the focal region of said lens close to said polepiece means whereby axially extending fields of said yoke are shielded from conductive portions of said magnetic circuit by said non-conductive polepiece means so that lens aberrations resulting from said field are minimized.

6. An electron beam column as defined in claim 5 wherein said polepiece means comprises a generally hollow cylinder partially closed at its upper and lower ends by hollow discs of non-conductive, magnetic material and wherein said deflection yoke means is positioned within said cylinder.

7. An electron beam column as defined in claim 6 wherein said polepiece means further comprises a plurality of hollow non-conductive, magnetic discs stacked in alternating sequence with a like plurality of hollow non-conductive non-magnetic discs, with the non-magnetic discs forming the flux gap of the magnetic circuit.

8. An electron beam column as defined in claim 5 wherein said magnetic discs are formed of ferrite ceramic material.

9. An electron beam column as defined in claim 7 wherein the non-magnetic discs are formed of alumina.

10. An electron beam column as defined in claim 5 wherein the magnetic and non-magnetic discs are surrounded by a confining layer of hardened bonding material whereby a composite stack of elements is provided.

11. In an electron beam column having a long focal length projection lens, a coil and a magnetic circuit for said lens which includes a composite polepiece and flux gap structure comprised of a plurality of hollow non-conductive magnetic discs stacked in alternating sequence with a corresponding plurality of hollow non-magnetic discs, with the magnetic discs forming a shield which minimizes astigmatism in the lens due to winding asymmetry in the coil and the non-magnetic discs comprising the flux gap of said magnetic circuit.

* * * * *